United States Patent
Ryu et al.

(10) Patent No.: US 8,476,636 B2
(45) Date of Patent: Jul. 2, 2013

(54) POLY-SI THIN FILM TRANSISTOR AND METHOD OF MANUFACTURING THE SAME

(75) Inventors: Myung-kwan Ryu, Yongin-si (KR); Kyung-bae Park, Seoul (KR); Sang-yoon Lee, Seoul (KR); Jang-yeon Kwon, Seongnam-si (KR); Byung-wook Yoo, Yongin-si (KR); Tae-sang Kim, Seoul (KR); Kyung-seok Son, Seoul (KR); Ji-sim Jung, Incheon (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 428 days.

(21) Appl. No.: 12/314,212

(22) Filed: Dec. 5, 2008

(65) Prior Publication Data

US 2010/0012942 A1 Jan. 21, 2010

(30) Foreign Application Priority Data

Jul. 15, 2008 (KR) .................. 10-2008-0068664

(51) Int. Cl.
| | |
|---|---|
| *H01L 29/76* | (2006.01) |
| *H01L 31/036* | (2006.01) |
| *H01L 31/112* | (2006.01) |
| *H01L 27/01* | (2006.01) |
| *H01L 27/12* | (2006.01) |

(52) U.S. Cl.
USPC .............. 257/66; 257/347; 257/316; 257/291

(58) Field of Classification Search
USPC ................ 257/291, 223, 227, 292, 439, 655, 257/316, 352, 353, 347, 348, 350, 66
See application file for complete search history.

(56) References Cited

U.S. PATENT DOCUMENTS

| | | | | |
|---|---|---|---|---|
| 5,879,976 | A | * | 3/1999 | Fujiwara ...................... 438/163 |
| 5,982,004 | A | * | 11/1999 | Sin et al. ...................... 257/347 |
| 6,218,219 | B1 | * | 4/2001 | Yamazaki et al. ............ 438/149 |
| 6,597,014 | B1 | * | 7/2003 | Yamazaki et al. .............. 257/59 |

FOREIGN PATENT DOCUMENTS

| | | |
|---|---|---|
| KR | 1019990030171 | 4/1999 |
| KR | 1020030082139 | 10/2003 |
| KR | 1020050003496 | 1/2005 |

* cited by examiner

*Primary Examiner* — Chuong A. Luu
(74) *Attorney, Agent, or Firm* — Harness, Dickey & Pierce, P.L.C.

(57) ABSTRACT

Provided may be a Poly-Si thin film transistor (TFT) and a method of manufacturing the same. The Poly-Si TFT may include a first Poly-Si layer on an active layer formed of Poly-Si and doped with a low concentration; and a second Poly-Si layer on the first Poly-Si layer and doped with the same concentration as the first Poly-Si layer or with a higher concentration than the first Poly-Si layer, wherein lightly doped drain (LDD) regions capable of reducing leakage current may be formed in inner end portions of the first Poly-Si layer.

9 Claims, 5 Drawing Sheets

POLY-SI THIN FILM TRANSISTOR AND METHOD OF MANUFACTURING THE SAME

PRIORITY STATEMENT

This application claims priority under U.S.C. §119 to Korean Patent Application No. 10-2008-0068664, filed on Jul. 15, 2008, in the Korean Intellectual Property Office (KIPO), the entire contents of which are incorporated herein by reference.

BACKGROUND

1. Field

Example embodiments relate to a Poly-Si thin film transistor (TFT) using Poly-Si as a channel material and a method of manufacturing the Poly-Si TFT.

2. Description of the Related Art

Poly-Si TFTs using Poly-Si as a channel material may be employed in panels of active matrix liquid crystal display devices (AMLCD) or active matrix organic light emitting display devices (AMOLED) due to their higher mobility. However, a process for manufacturing the Poly-Si TFTs may be complicated, and when Poly-Si are formed using a laser, applying the Poly-Si TFTs to large-sized panels may be difficult because of non-uniformity due to laser crystallization. In order to solve such problems, research has been conducted to manufacture a Poly-Si TFT by crystallizing amorphous silicon (a-Si) in a furnace without using a laser.

TFTs may be classified, based on their structure, into top gate structure types and bottom gate structure types depending on a location of a gate. The top gate structure may be applied to mass production of a Poly-Si TFT, and the bottom gate structure may be generally applied to mass production of an amorphous silicon TFT. Manufacturing the bottom gate structure requires a relatively small number of processes, and thus, the bottom gate structure may be more advantageous in cost reduction than the top gate structure. On the other hand, Poly-Si TFTs need to employ a lightly doped drain (LDD) structure in order to reduce leakage current, but in order to employ the LDD structure, a photolithography process and an ion implantation process may be additionally required.

SUMMARY

Example embodiments provide a Poly-Si TFT having a bottom gate structure and a method of manufacturing the Poly-Si TFT.

According to example embodiments, a Poly-Si TFT may include an active layer on a gate insulating layer and formed of Poly-Si; first Poly-Si layers on both side surfaces of the active layer and doped with a low concentration; and second Poly-Si layers on the first Poly-Si layers and doped with the same concentration as the first Poly-Si layer or with a higher concentration than the first Poly-Si layer.

The method may further include a gate on a substrate; the gate insulating layer on the substrate configured to cover the gate; and source and drain electrodes on the second Poly-Si layers.

Inner end portions of the first Poly-Si layers may be exposed to form lightly doped drain (LDD) regions. The LDD regions may be configured not to overlap with the gate electrode. The concentration of impurities in the first Poly-Si layer may be less than about $1\times10^{18}/cm^3$, and the concentration of impurities in the second Poly-Si layer may be less than about $1\times10^{21}/cm^3$. The first Poly-Si layers and the second Poly-Si layers may be integrally formed.

The method may further include a passivation layer configured to cover the source and drain electrodes; and a pixel electrode on the passivation layer and electrically connected to the drain electrode. A via hole for electrically connecting the drain electrode and the pixel electrode may be formed in the passivation layer. Inner end portions of the first Poly-Si layers may be exposed to form LDD regions.

According to example embodiments, a method of manufacturing a Poly-Si TFT may include sequentially forming a gate and a gate insulating layer on a substrate; sequentially forming an active layer, a first Poly-Si layer doped with a low concentration, and a second Poly-Si layer doped with the same concentration as the first Poly-Si layer or with a higher concentration than the first Poly-Si layer on the gate insulating layer; patterning the active layer, the first Poly-Si layer, and the second Poly-Si layer; depositing an electrode layer configured to cover the active layer and the first and the second Poly-Si layers; forming source and drain electrodes by patterning the electrode layer; removing first and second Poly-Si layers formed on the gate; and exposing inner end portions of the first Poly-Si layers by removing inner end portions of the second Poly-Si layers exposed by the source and drain electrodes.

Forming the active layer and the first and second Poly-Si layers may include sequentially depositing an amorphous silicon layer, a first amorphous silicon layer doped with a low concentration, and a second amorphous silicon layer doped with the same concentration as the first amorphous silicon layer or with a higher concentration than the first amorphous silicon layer on the gate insulating layer; and crystallizing the amorphous silicon layer and the first and second amorphous silicon layers.

The amorphous silicon layer and the first and second amorphous silicon layers may be crystallized by furnace annealing, and the crystallization may be performed at a temperature of more than about 550° C. Forming the source electrode and the drain electrode may include depositing a photoresist on the electrode layer and patterning the photoresist; and performing wet etching on the electrode layer for a predetermined or given time by using the patterned photoresist as an etching mask.

The first and second Poly-Si layers formed on the gate may be removed by dry etching portions of the first and second Poly-Si layers exposed through the patterned photoresist. Exposing the inner end portions of the first Poly-Si layers may include removing a part of the patterned photoresist until inner end portions of the source and drain electrodes may be exposed; exposing the inner end portions of the first Poly-Si layers by removing the inner end portions of the second Poly-Si layers exposed by the source and drain electrodes by using the photoresist and the source and drain electrodes as an etching mask; and removing the photoresist.

Exposing the inner end portions of the first Poly-Si layers may include removing the photoresist formed on the source and drain electrodes; and exposing the inner end portions of the first Poly-Si layers by removing the inner end portions of the second Poly-Si layers exposed by the source and drain electrodes by using the source and drain electrode as etching masks.

According to example embodiments, additional photolithography and ion implantation processes for forming a LDD region may not be required. Thus, the manufacturing process may be simplified and the manufacturing cost may be reduced, thereby realizing a Poly-Si TFT having a bottom gate structure capable of reducing leakage current.

BRIEF DESCRIPTION OF THE DRAWINGS

Example embodiments will be more clearly understood from the following detailed description taken in conjunction with the accompanying drawings.

FIG. 1 is a schematic cross-sectional view of a Poly-Si TFT according to example embodiments;

FIG. 2 is a schematic cross-sectional view of a display panel employing the Poly-Si TFT of FIG. 1; and FIGS. 3-12 illustrate a method of manufacturing the Poly-Si TFT of FIG. 1 according to example embodiments.

Figure 1:
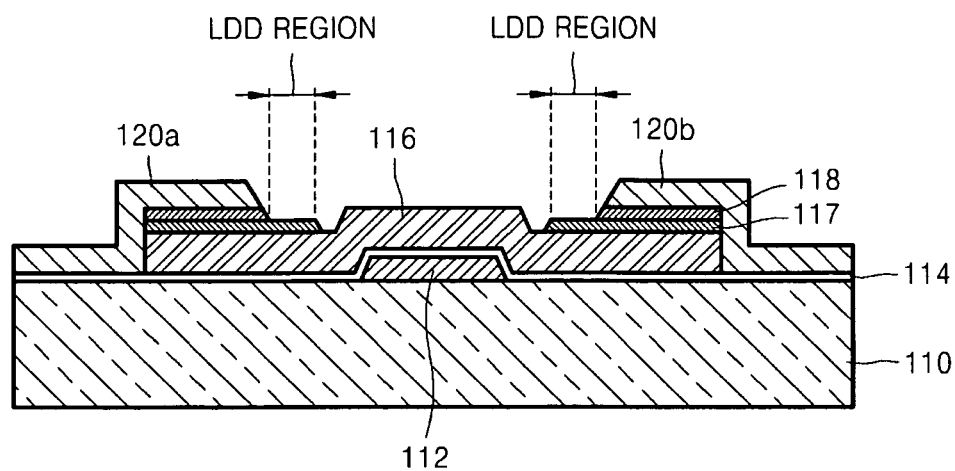
FIGS. 1-12 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will be described more fully hereinafter with reference to the accompanying drawings, in which example embodiments are shown. Example embodiments may, however, be embodied in different forms and should not be construed as limited to example embodiments set forth herein. Rather, example embodiments are provided so that this disclosure will be thorough and complete, and will fully convey the scope of example embodiments to those skilled in the art. In the drawings, the thickness of layers and regions are exaggerated for clarity. Like numbers refer to like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a Poly-Si TFT according to example embodiments. Referring to FIG. 1, a gate 112 and a gate insulating layer 114 may be sequentially formed on a substrate 110. The substrate 110 may use a glass substrate as a transparent substrate, or alternatively, may use a transparent plastic substrate. Although not shown in the drawings, an underlayer for preventing or reducing the substrate 110 from being soiled may be formed on a surface of the substrate 110. The underlayer may be, for example, a silicon oxide layer, a silicon nitride layer, or a metal oxide layer. The gate 112 may be formed on the substrate 110 in a predetermined or given form, may be formed by depositing a predetermined or given gate metal on the substrate 110 and patterning the gate metal. The gate insulating layer 114 may be formed on the substrate 110 configured to cover the gate 112. The gate insulating layer 114 may be, for example, a silicon nitride layer or a silicon oxide layer, but example embodiments are not limited thereto.

An active layer 116 constituting a channel may be formed on the gate insulating layer 114 formed on the gate 112. The active layer 116 may be formed of Poly-Si. Two first Poly-Si layers 117 and two second Poly-Si layers 118 may be sequentially formed on the active layer 116. In more detail, the first Poly-Si layers 117 doped with a relatively low concentration may be formed on both side surfaces of the active layer 116, and the second Poly-Si layers 118 doped with the same concentration as the first Poly-Si layers 117 or with a higher concentration than the first Poly-Si layers 117 formed on the first Poly-Si layers 117. The second Poly-Si layers 118 may function as an ohmic contact layer. Inner end portions of the first Poly-Si layers 117 doped with a relatively low concentration may be exposed by the second Poly-Si layers 118, and the exposed inner end portions of the first Poly-Si layer 117 may form lightly doped drain (LDD) regions.

The LDD regions may function to reduce leakage current in a Poly-Si TFT having a bottom gate structure. The width of the LDD region may be in the range of about 0 to about 5 μm, but example embodiments are not limited thereto. In example embodiments, the LDD regions may be configured not to overlap with the gate 112, but alternatively, the LDD regions may be configured to overlap with the gate 112. When the concentration of impurities in the first Poly-Si layer 117 and the concentration of impurities in the second Poly-Si layer 118 is equal, the first and second Poly-Si layers 117 and 118 may be integrally formed of the same material.

When the active layer 116 is an n-type channel, the first and second Poly-Si layers 117 and 118 may be formed of n⁻ poly-Si and n⁺ poly-Si, respectively. The concentration of impurities, e.g., P, As, and Sb, in the first Poly-Si layers 117 may be less than about $1\times10^{18}/cm^3$, and the concentration of impurities, e.g., P, As, and Sb, in the second Poly-Si layers 118 may be less than about $1\times10^{21}/cm^3$. The concentrations of silicon in the first and second Poly-Si layers 117 and 118 may be about $5\times10^{22}/cm^3$, but example embodiments are not limited thereto. On the other hand, when the active layer 116 is a p-type channel, the first and second Poly-Si layers 117 and 118 may be formed of p⁻ poly-Si and p⁺ poly-Si, respectively. In example embodiments, the concentration of impurities, e.g., B, Al, Ga, and In, in the first Poly-Si layers 117 may be less than about $1\times10^{18}/cm^3$, and the concentration of impurities, e.g., B, Al, Ga, and In, in the second Poly-Si layers 118 may be less than about $1\times10^{21}/cm^3$.

A source electrode 120a and a drain electrode 120b may be formed on the second Poly-Si layers 118. The source electrode 120a and the drain electrode 120b may be formed of, for example, Cu, Mo or Al, or alternatively, may be formed of various conductive metals. The source electrode 120a and the drain electrode 120b may be formed in a single-layered structure or a multi-layered structure.

According to example embodiments, a Poly-Si TFT having a bottom gate structure including an LDD region capable of reducing leakage current may be realized. The Poly-Si TFT having the bottom gate structure may be employed in a display panel of a liquid crystal display (LCD) or an organic light emitting diode (OLED).

Figure 2:
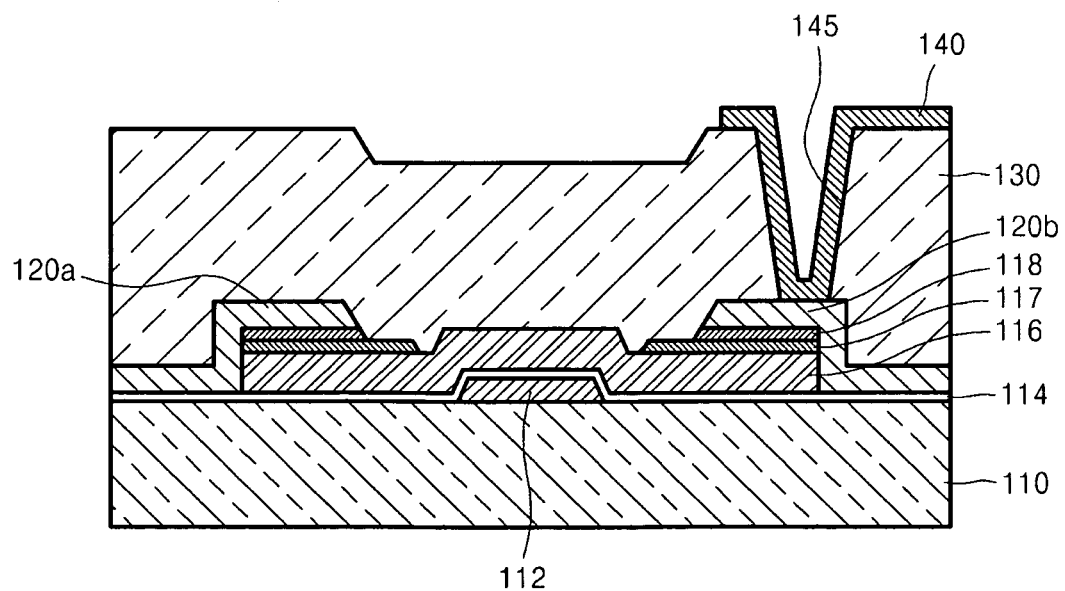

FIG. 2 is a schematic cross-sectional view of a display panel employing the Poly-Si TFT of FIG. 1. Referring to FIG. 2, a passivation layer 130 may be configured to cover the source electrode 120a, the drain electrode 120b, the first and second Poly-Si layers 117 and 118, and the active layer 116. The passivation layer 130 may be a silicon nitride layer or a silicon oxide layer, and may be formed of another material layer. A pixel electrode 140, which is a transparent electrode, may be formed on the passivation layer 130. The pixel electrode 140 may be formed of, for example, indium tin oxide (ITO), or indium zinc oxide (IZO), but example embodiments are not limited thereto. A via hole 145, for electrically connecting the pixel electrode 140 and the drain electrode 120b, may be formed in the passivation layer 130.

Figure 3:
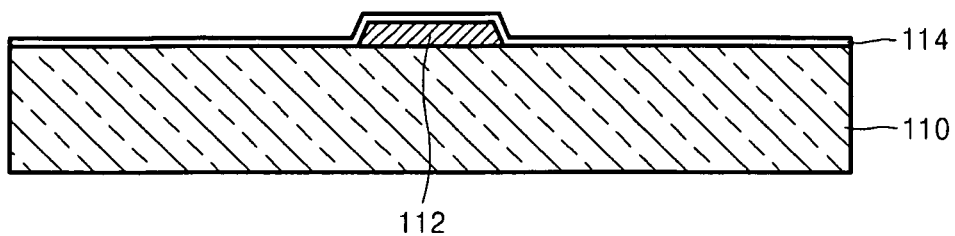

Hereinafter, a method of manufacturing the Poly-Si TFT of FIG. 1 will be described. FIGS. 3-12 illustrate a method of manufacturing the Poly-Si TFT of FIG. 1 according to example embodiments. Referring to FIG. 3, the substrate 110 may be prepared, and the gate 112 and the gate insulating layer 114 may be sequentially formed on the substrate 110. The substrate 110 may generally use a transparent glass substrate, or alternatively, may use a transparent plastic substrate.

An underlayer (not shown) for preventing or reducing the substrate 110 from being soiled may be formed on a surface of the substrate 110. The gate 112 may be formed by depositing a predetermined or given gate metal on the substrate 110 and patterning the gate metal in a predetermined or given pattern. The gate insulating layer 114 may be formed on the substrate 110 and configured to cover the gate 112, and may be formed by depositing, for example, a silicon nitride layer or a silicon oxide layer, on the substrate 110.

Figure 4:
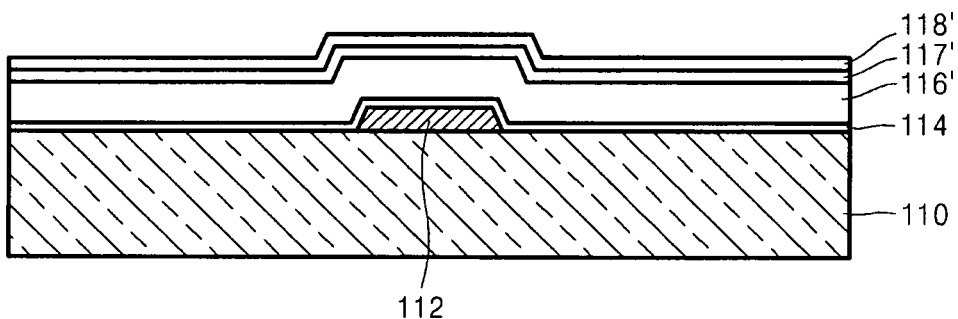

Referring to FIG. 4, an amorphous silicon layer 116', a first amorphous silicon layer 117' doped with a low concentration, and a second amorphous silicon layer 118' doped with the same concentration as the first amorphous silicon layer 117' or with a higher concentration than the first amorphous silicon layer 117' may be sequentially formed on the gate insulating layer 114. The amorphous silicon layer 116', the first amorphous silicon layer 117', and the second amorphous silicon layer 118' may be sequentially deposited on the gate insulating layer 114. When the concentration of impurities in the first amorphous silicon layer 117' and the concentration of impurities in the second amorphous silicon layer 118' are equal, the first and second amorphous silicon layers 117' and 118' may be integrally formed of the same material.

When a TFT having an n-type channel is formed, the first and second amorphous silicon layers 117' and 118' may be formed of n⁻ a-Si and n⁺ a-Si, respectively. In example embodiments, the concentration of impurities, e.g., P, As, and Sb, in the first amorphous silicon layer 117' may be less than about $1\times10^{18}/cm^3$, and the concentration of impurities, e.g., P, As, and Sb, in the second amorphous silicon layer 118' may be less than about $1\times10^{21}/cm^3$. However, example embodiments are not limited thereto.

On the other hand, when a TFT having a p-type channel is formed, the first and second amorphous silicon layers 117' and 118' may be formed of p⁻ a-Si and p⁺ a-Si, respectively. In example embodiments, the concentration of impurities, e.g., B, Al, Ga, and In, in the first amorphous silicon layer 117' may be less than about $1\times10^{18}/cm^3$, and the concentration of impurities, e.g., B, Al, Ga, and In, in the second amorphous silicon layer 118' may be less than about $1\times10^{21}/cm^3$.

Figure 5:
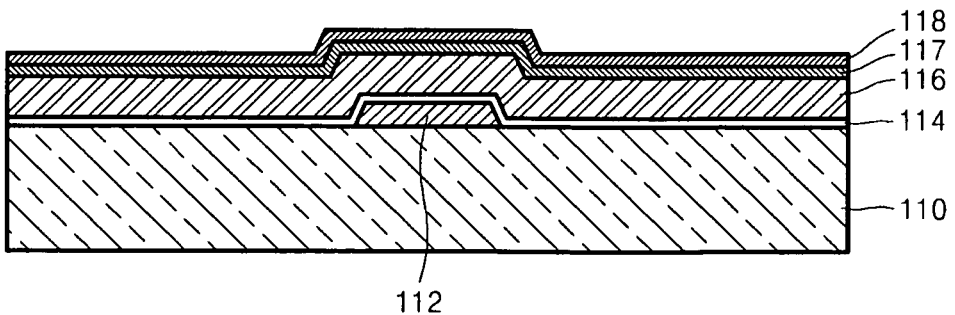

Referring to FIG. 5, the amorphous silicon layer 116', the first amorphous silicon layer 117', and the second amorphous silicon layer 118' sequentially deposited on the gate insulating layer 114 may be crystallized. Thus, the active layer 116 formed of Poly-Si, the first Poly-Si layer 117 doped with a low concentration, the second Poly-Si layer 118 doped with the same concentration as the first Poly-Si layer 117 or with a higher concentration than the first Poly-Si layer 117 may be sequentially formed on the gate insulating layer 114. The crystallization of the amorphous silicon layer 116' and the first and second amorphous silicon layers 117' and 118' may be performed by furnace annealing. The crystallization may be performed at a temperature of, for example, more than about 550° C., e.g., at a temperature range of about 600° C. to about 700° C., but example embodiments are not limited thereto. The crystallization by the furnace annealing may use a metal induced crystallization (MIC) method where a thin film metal, e.g., Ni, Al, Pd, Ag or Au, is deposited on a surface of the second amorphous silicon layer 118', and a thermal treatment process may be performed at a predetermined or given temperature. The metal, e.g., Ni, Al, Pd, Ag or Au, may be used to accelerate crystallization, and those metals may remain inside the first and second Poly-Si layers 117 and 118 after the crystallization. Also, the crystallization of the amorphous silicon layer 116' and the first and second amorphous silicon layers 117' and 118' may be performed by laser annealing or lamp heating in addition to furnace annealing.

In the above description, a method of forming the active layer 116 and the first and second Poly-Si layers 117 and 118 by depositing the amorphous silicon layer 116' and the first and second amorphous silicon layers 117' and 118' on the gate insulating layer 114 and performing crystallization thereon has been described. However, example embodiments may not be limited thereto. For example, a Poly-Si layer may be formed with a predetermined or given thickness on the gate insulating layer 114, a Poly-Si layer with a relatively low concentration may be formed on the Poly-Si layer using an ion implantation process, and a Poly-Si layer with a relatively high concentration may be formed on the Poly-Si layer with a relatively low concentration using an ion implantation process. Also, a Poly-Si layer, a Poly-Si layer with a lower concentration and a Poly-Si layer with a higher concentration may be sequentially deposited on the gate insulating layer 114 without using crystallization.

Figure 6:
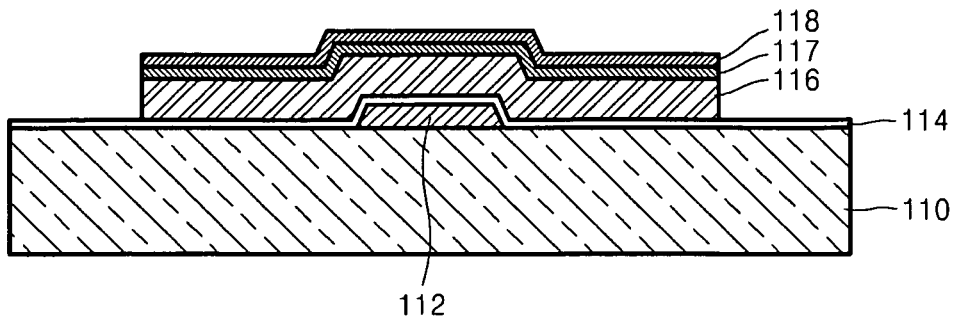
Figure 7:
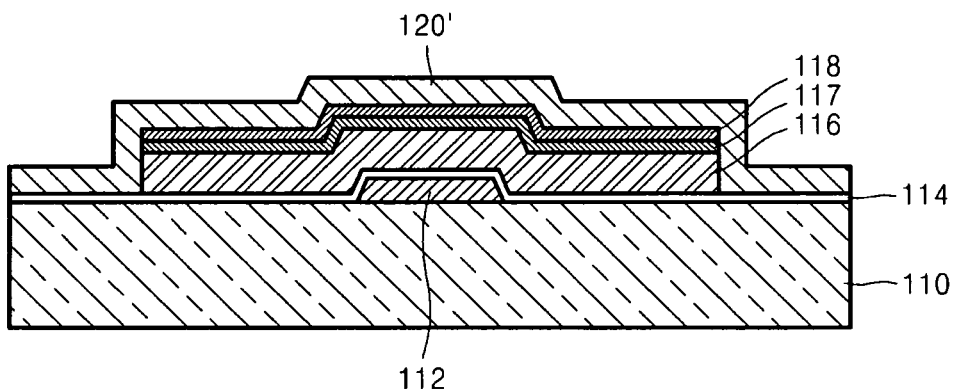

Referring to FIG. 6, the active layer 116 and the first and second Poly-Si layers 117 and 118 sequentially formed on the gate insulating layer 114 may be patterned using photolithography. Thus, the active layer 116 and the first and second Poly-Si layers 117 and 118 may be formed in a predetermined or given pattern on the gate insulating layer 114 formed on the gate 112. Referring to FIG. 7, an electrode layer 120' may be formed on the gate insulating layer 114, and configured to cover the active layer 116, the first Poly-Si layer 117, and the second Poly-Si layer 118. The electrode layer 120' may be formed by depositing a conductive metal, e.g., Cu, Mo or Al, on the gate insulating layer 114 configured to cover the active layer 116 and the first and second Poly-Si layers 117 and 118. The electrode layer 120' may be formed to have a single-layered structure or a multi-layered structure.

Figure 8:
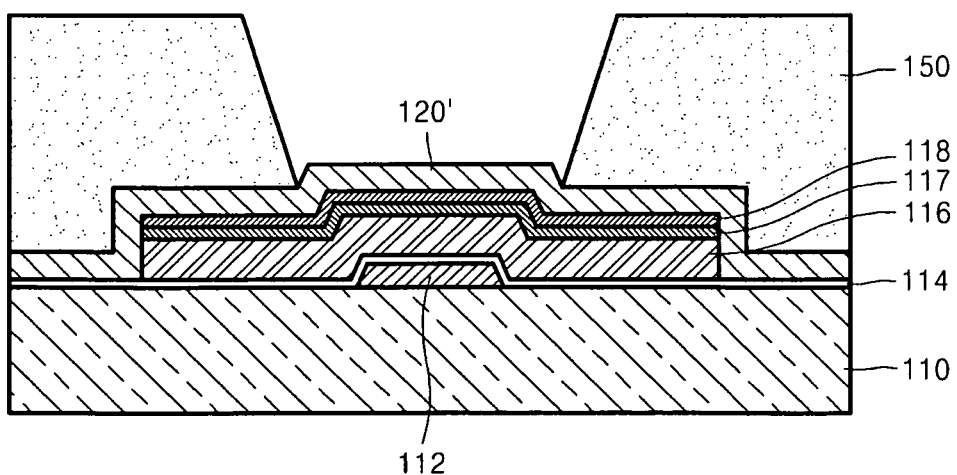
Figure 9:
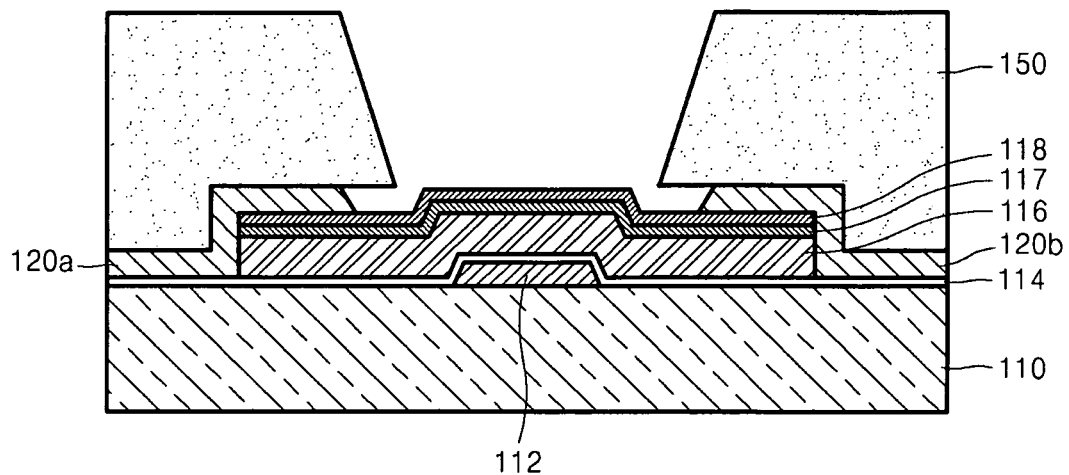

Referring to FIG. 8, a photoresist may be deposited with a predetermined or given thickness and configured to cover the electrode layer 120', which may be patterned. The electrode layer 120' formed on the gate 112 may be exposed through the patterned photoresist 150. Referring to FIG. 9, wet etching may be performed on the electrode layer 120' exposed through the patterned photoresist 150 for a predetermined or given time. Thus, the electrode layer 120' may be etched so as to recede up to a predetermined or given length back from inner walls of the patterned photoresist 150, thereby forming the source electrode 120a and the drain electrode 120b.

Figure 10:
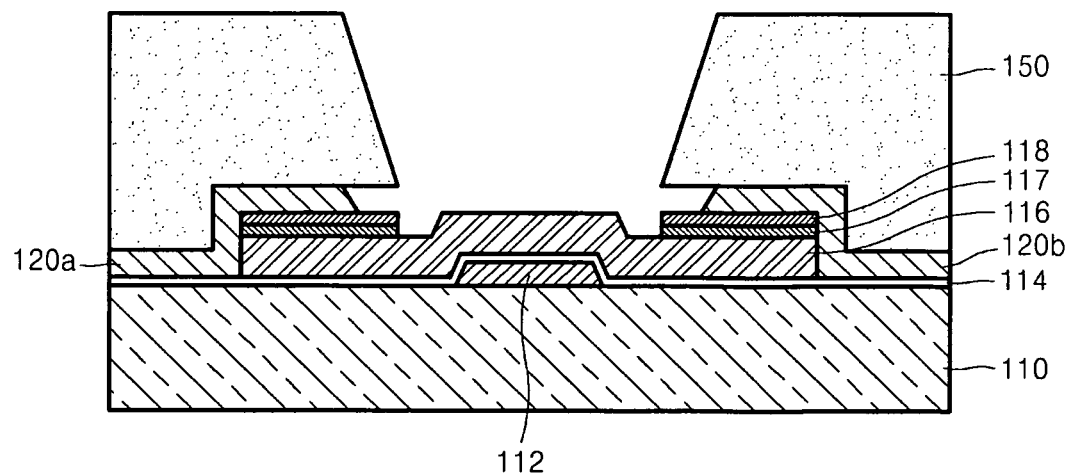
Figure 11:
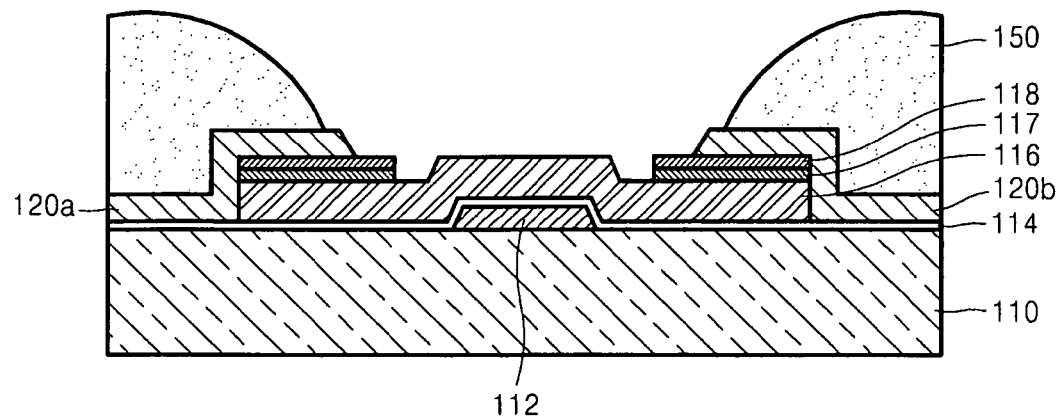

Referring to FIG. 10, dry etching may be sequentially performed on the exposed second Poly-Si layer 118 and the first Poly-Si layer 117 formed below the second Poly-Si layer 118. Referring to FIG. 11, a part of the photoresist 150 may be removed through plasma ashing using, for example, oxygen plasma, until inner end portions of the source electrode 120a and the drain electrode 120b may be exposed.

Figure 12:
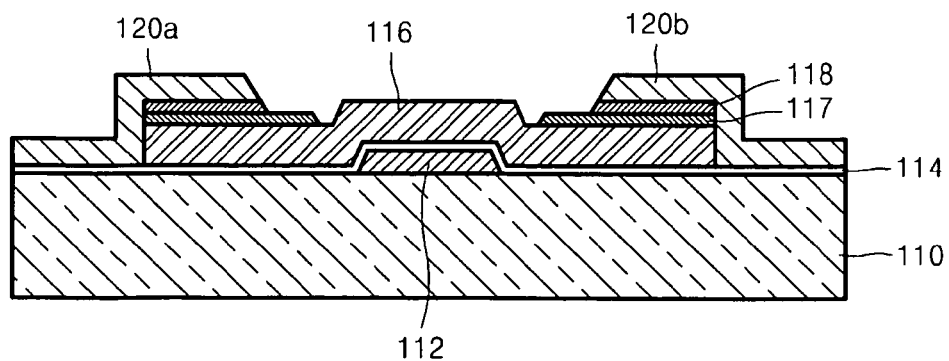

Referring to FIG. 12, the exposed inner end portions of the second Poly-Si layer 118 may be removed through dry etching by using the photoresist 150, the source electrode 120a, and the drain electrode 120b as etching masks. Thus, the inner end portions of the first Poly-Si layer 117 may be externally exposed. In the etching process of the second Poly-Si layer 118, a part of the active layer 116 formed of Poly-Si may be etched. Also, because a part of the first Poly-Si layer 117 formed below the second Poly-Si layer 118 exposed is etched by over-etching the second Poly-Si layer 118 during the etching process, the thickness of the first Poly-Si layer 117 exposed may be lower. The exposed parts of the first Poly-Si layer 117 may form LDD regions functioning to reduce leakage current.

Finally, the photoresist 150 remaining on the source electrode 120a and the drain electrode 120b may be removed by, for example, PR strip, thereby completing manufacture of the Poly-Si TFT according to example embodiments.

In the above description, in order to remove the exposed part of the second Poly-Si layers 118, a part of the photoresist 150 formed on the source electrode 120a and the drain electrode 120b may be removed and the photoresist 150 may be used as an etching mask. Such a method may prevent or reduce the source electrode 120a and the drain electrode 120b from being soiled and prevent or reduce plasma from being unstable during the dry etching of the second Poly-Si layers 118. However, in example embodiments, any photoresist 150 remaining on the source electrode 120a and the drain electrode 120b may be completely removed, and the exposed part of the second Poly-Si layers 118 may be removed through dry etching by using the source electrode 120a and the drain electrode 120b as etching masks.

In example embodiments, additional photolithography process and ion implantation process for preventing or reducing leakage current may not be required for manufacture of the Poly-Si TFT having a bottom gate structure. Thus, the manufacturing process may be simplified and manufacturing costs may be reduced.

While example embodiments have been particularly shown and described with reference to example embodiments thereof, it will be understood by one of ordinary skill in the art that various changes in form and details may be made therein without departing from the spirit and scope of example embodiments as defined by the following claims.

What is claimed is:

1. A Poly-Si TFT comprising:
   an active layer on a gate insulating layer and formed of Poly-Si;
   first Poly-Si layers on both side surfaces of the active layer and doped with a low concentration; and
   second Poly-Si layers on the first Poly-Si layers and doped with the same concentration as the first Poly-Si layer or with a higher concentration than the first Poly-Si layer.

2. The Poly-Si TFT of claim 1, further comprising:
   a gate on a substrate;
   the gate insulating layer on the substrate configured to cover the gate; and
   source and drain electrodes on the second Poly-Si layers.

3. The Poly-Si TFT of claim 2, wherein inner end portions of the first Poly-Si layers are exposed to constitute lightly doped drain (LDD) regions.

4. The Poly-Si TFT of claim 3, wherein the LDD regions are configured not to overlap with the gate.

5. The Poly-Si TFT of claim 1, wherein the concentration of impurities in the first Poly-Si layer is less than about $1 \times 10^{18}/cm^3$.

6. The Poly-Si TFT of claim 1, wherein the concentration of impurities in the second Poly-Si layer is less than about $1 \times 10^{21}/cm^3$.

7. The Poly-Si TFT of claim 1, wherein the first Poly-Si layers and the second Poly-Si layers are integrally formed.

8. The Poly-Si TFT of claim 2, further comprising:
   a passivation layer configured to cover the source and drain electrodes; and
   a pixel electrode on the passivation layer and electrically connected to the drain electrode.

9. The Poly-Si TFT of claim 8, wherein a via hole for electrically connecting the drain electrode and the pixel electrode is formed in the passivation layer.

* * * * *